US012787854B2

(12) United States Patent
Chiu et al.

(10) Patent No.: US 12,787,854 B2
(45) Date of Patent: Nov. 3, 2026

(54) POWER CHIP PACKAGE STRUCTURE

(71) Applicant: TONG HSING ELECTRONIC INDUSTRIES, LTD., Taipei City (TW)

(72) Inventors: Zzu-Chi Chiu, Taipei City (TW); Yu-Te Hsieh, Taipei City (TW); Yan-Wei Chen, Taipei City (TW); Chih-Yu Chung, Taipei City (TW); Yu-Ju Kuo, Taipei City (TW)

(73) Assignee: TONG HSING ELECTRONIC INDUSTRIES, LTD., Taoyuan City (TW)

( * ) Notice: Subject to any disclaimer, the term of this patent is extended or adjusted under 35 U.S.C. 154(b) by 371 days.

(21) Appl. No.: 18/739,335

(22) Filed: Jun. 11, 2024

(65) Prior Publication Data

US 2025/0336878 A1 Oct. 30, 2025

(30) Foreign Application Priority Data

Apr. 29, 2024 (TW) ................................ 113115903

(51) Int. Cl.
*H10W 74/10* (2026.01)
*H10W 40/22* (2026.01)
(Continued)

(52) U.S. Cl.
CPC ......... *H10W 74/121* (2026.01); *H10W 40/22* (2026.01); *H10W 70/65* (2026.01);
(Continued)

(58) Field of Classification Search
CPC ... H10W 70/458; H10W 70/69; H10W 72/60; H10W 72/983; H10W 74/00; H10W 74/012
See application file for complete search history.

(56) References Cited

U.S. PATENT DOCUMENTS 6,320,251 B1 * 11/2001 Glenn ................ H10W 70/415
257/E23.048
9,923,059 B1 * 3/2018 Tu ...................... H10D 30/0221
(Continued)

FOREIGN PATENT DOCUMENTS

CN 216980554 U 7/2022
CN 217522988 U * 9/2022
(Continued)

*Primary Examiner* — Edward Chin
(74) *Attorney, Agent, or Firm* — Winston Hsu

(57) ABSTRACT

A power chip package structure includes a power chip, a first transmission member, two second transmission members, an encapsulant, and an insulating inorganic member. The first and second transmission members are connected to the power chip. The power chip, the first and second transmission members are embedded in the encapsulant. The encapsulant has a layout surface and a slot recessed in the layout surface, and the first and second transmission members are exposed from the layout surface. The first transmission member and an adjacent one of the two second transmission members are spaced apart from each other through the slot by a separation distance. The insulating inorganic member is fixed in the slot. The first transmission member and the adjacent second transmission member jointly define a creepage path that travels along an outer surface of the insulating inorganic member and that is greater than the separation distance.

20 Claims, 10 Drawing Sheets

(51) Int. Cl.
*H10W 70/65* (2026.01)
*H10W 72/60* (2026.01)
*H10W 90/00* (2026.01)

(52) U.S. Cl.
CPC ........ *H10W 72/622* (2026.01); *H10W 72/641* (2026.01); *H10W 72/652* (2026.01); *H10W 90/734* (2026.01); *H10W 90/796* (2026.01)

(56) References Cited

U.S. PATENT DOCUMENTS

| | | | | |
|---|---|---|---|---|
| 10,147,672 | B2 | 12/2018 | Lin | |
| 10,483,178 | B2 | 11/2019 | Manjappaiah | |
| 11,049,790 | B2 | 6/2021 | Fuergut | |
| 11,152,288 | B2 | 10/2021 | Bonifacio | |
| 11,404,359 | B2 | 8/2022 | Schwab | |
| 11,735,488 | B2 | 8/2023 | McPherson | |
| 2023/0260861 | A1* | 8/2023 | Dezsi | H10W 40/255 257/675 |
| 2023/0420329 | A1* | 12/2023 | Salman | H10W 40/22 |
| 2024/0105447 | A1* | 3/2024 | Funke | H10P 14/6339 |
| 2024/0213124 | A1* | 6/2024 | Mcpherson | H10W 40/10 |
| 2025/0038082 | A1* | 1/2025 | Fürgut | H10W 70/415 |

FOREIGN PATENT DOCUMENTS

| | | | | | |
|---|---|---|---|---|---|
| CN | 219696448 | U | * | 9/2023 | |
| DE | 112021004773 | T5 | * | 2/2024 | H10W 74/111 |

* cited by examiner

POWER CHIP PACKAGE STRUCTURE

BACKGROUND OF THE INVENTION

1. Field of the Invention

The present invention relates to a package structure, and in particular to a power chip package structure.

2. Description of the Prior Art

The existing power chip package structure has a creepage distance along the outer surface of the package between its two electrodes, and for safety considerations of the existing power chip package structure, the creepage distance has strict standards, which will affect development of existing power chip package structures. Therefore, the inventor believed that the above-mentioned defects could be improved, so he devoted himself to research and applied scientific principles, and finally proposed an invention that is reasonably designed and effectively improves the above-mentioned defects.

SUMMARY OF THE INVENTION

Embodiments of the present invention provide a power chip package structure that can effectively improve defects that may occur in existing power chip package structures.

An embodiment of the present invention discloses a power chip package structure, which includes: a power chip including a chip body having a first surface and an opposing second surface; a first bonding pad located on the first surface; and two second bonding pads spaced apart from each other on the second surface; a first transmission member connected to the first bonding pad, wherein the first transmission member has a first end surface far away from the first bonding pad; two second transmission members respectively connected to the two second bonding pads, wherein each of the two second transmission members has a second end surface at a distance away from the second bonding pad to which it is connected; an encapsulant that encapsulates the power chip, the first transmission member, and the two second transmission members; wherein the encapsulant includes: a layout surface, which exposes the first end surface and the two second end surfaces; and two side end surfaces, respectively connected to the opposite end edges of the layout surface, and wherein a slot is recessed into the layout surface of the encapsulant, which runs through the two side end surfaces; wherein the first end surface and the adjacent second end surface are separated by the slot along a preset direction and are separated by a separation distance; and an insulating inorganic member fixed within the slot and does not protrude from the slot opening of the slot; wherein the insulating inorganic member is formed with an undulating surface facing the slot opening, and the two ends of the undulating surface are respectively adjacent to the two side end surfaces of the encapsulant; wherein a creepage path along the undulating surface is defined between the first end surface and the adjacent second end surface, which is greater than the separation distance.

An embodiment of the present invention discloses a power chip package structure, which includes: a power chip including a chip body having a first surface and an opposing second surface; a first bonding pad located on the first surface; and two second bonding pads spaced apart from each other on the second surface; a first transmission member connected to the first bonding pad, wherein the first transmission member has a first end surface away from the first bonding pad; two second transmission members, respectively connected to the two second bonding pads, wherein each of the two second transmission members has a second end surface away from the second bonding pad to which it is connected; an encapsulant that encapsulates the power chip, the first transmission member, and the two second transmission members; wherein the encapsulant includes: a layout surface, which exposes the first end surface and the two second end surfaces; and two side end surfaces, respectively connected to the opposite end edges of the layout surface, and wherein a slot is recessed into the layout surface of the encapsulant, which runs through the two side end surfaces; wherein the first end surface and the adjacent second end surface are separated by the slot along a preset direction and are separated by a separation distance; and an insulating inorganic member, which is fixed within the slot and does not protrude from the slot opening of the slot; wherein the two end faces of the insulating inorganic member are respectively adjacent to the two side end surfaces of the encapsulant; wherein a creepage path along the outer surface of the insulating inorganic member is defined between the first end surface and the adjacent second end surface, which is greater than the separation distance.

To sum up, when the power chip package structure disclosed in the embodiments of the present invention adopts the same size as the existing power chip package structure, the creepage path can be more accurately controlled to be larger than the standard for the creepage distance of the existing power chip package structure, thereby improving the performance of the power chip package structure and reducing the possibility of damage.

From another perspective, when the creepage path of the power chip package structure disclosed in the embodiments adopts the same creepage distance standard as the standard for the creepage distance of the existing power chip package structure, the size of the power chip package structure can be further reduced. Therefore, it is beneficial to expand the application of the power chip package structure.

These and other objectives of the present invention will no doubt become obvious to those of ordinary skill in the art after reading the following detailed description of the preferred embodiment that is illustrated in the various figures and drawings.

DETAILED DESCRIPTION

The following is a specific example to illustrate the implementation of the "power chip package structure" disclosed in the present invention. Those skilled in the art can understand the advantages and effects of the present invention from the content disclosed in this specification. The present invention can be implemented or applied through other different specific embodiments, and various details in this specification can also be modified and changed based on different viewpoints and applications without departing from the concept of the present invention. In addition, the drawings of the present invention are only simple schematic illustrations and are not depictions based on actual dimensions, as is stated in advance. The following embodiments will further describe the relevant technical content of the present invention in detail, but the disclosed content is not intended to limit the scope of the present invention.

It should be understood that although terms such as "first", "second" and "third" may be used herein to describe various elements or signals, these elements or signals should not be limited by these terms. These terms are primarily used to distinguish one component from another component or one signal from another signal. In addition, the term "or" used in this article shall include any one or combination of more of the associated listed items depending on the actual situation.

Embodiment I

Figure 1:
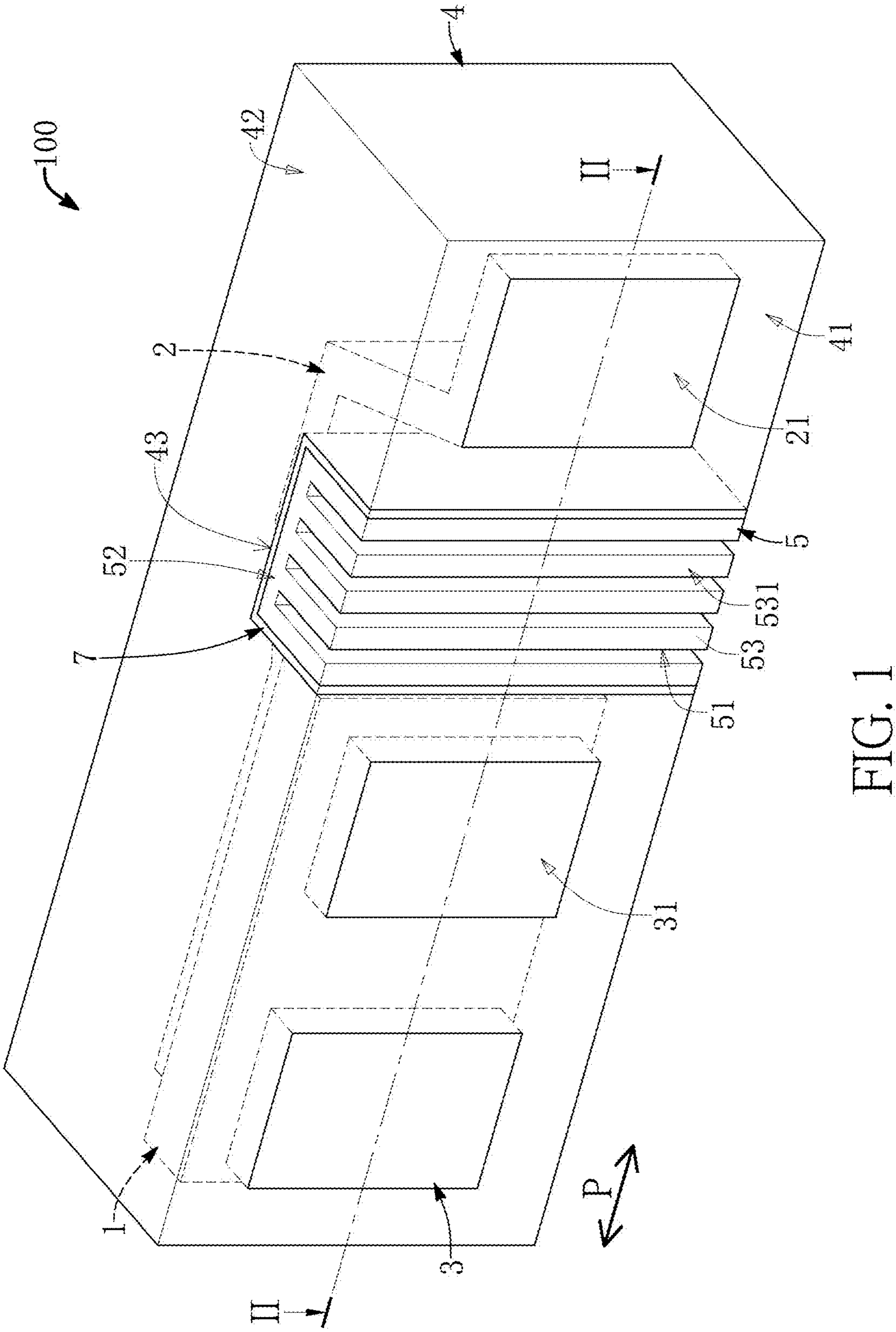
FIG. 1 is a three-dimensional schematic diagram of a power chip package structure according to Embodiment I of the present invention.
Figure 2:
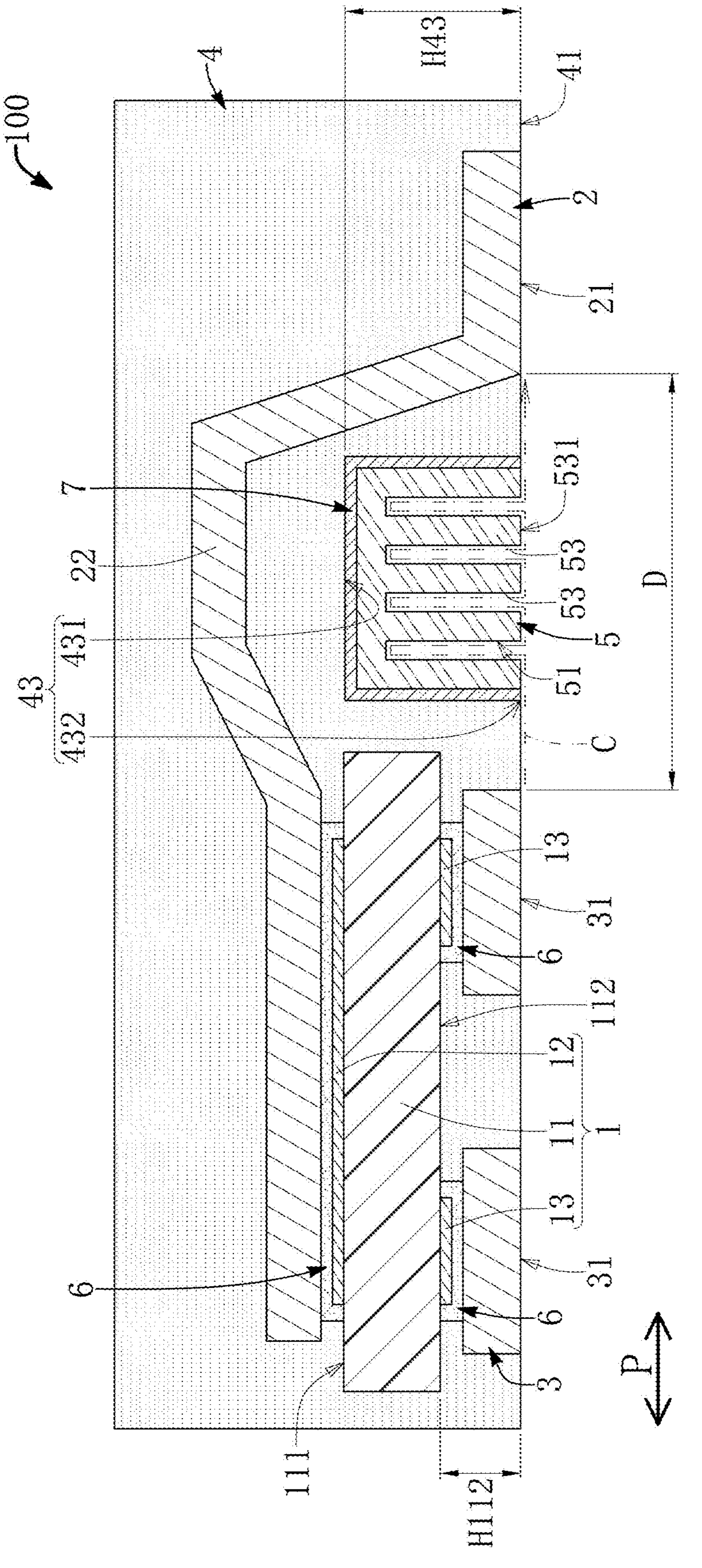
FIG. 2 is a schematic cross-sectional view taken along line II-II of FIG. 1.
Figure 3:
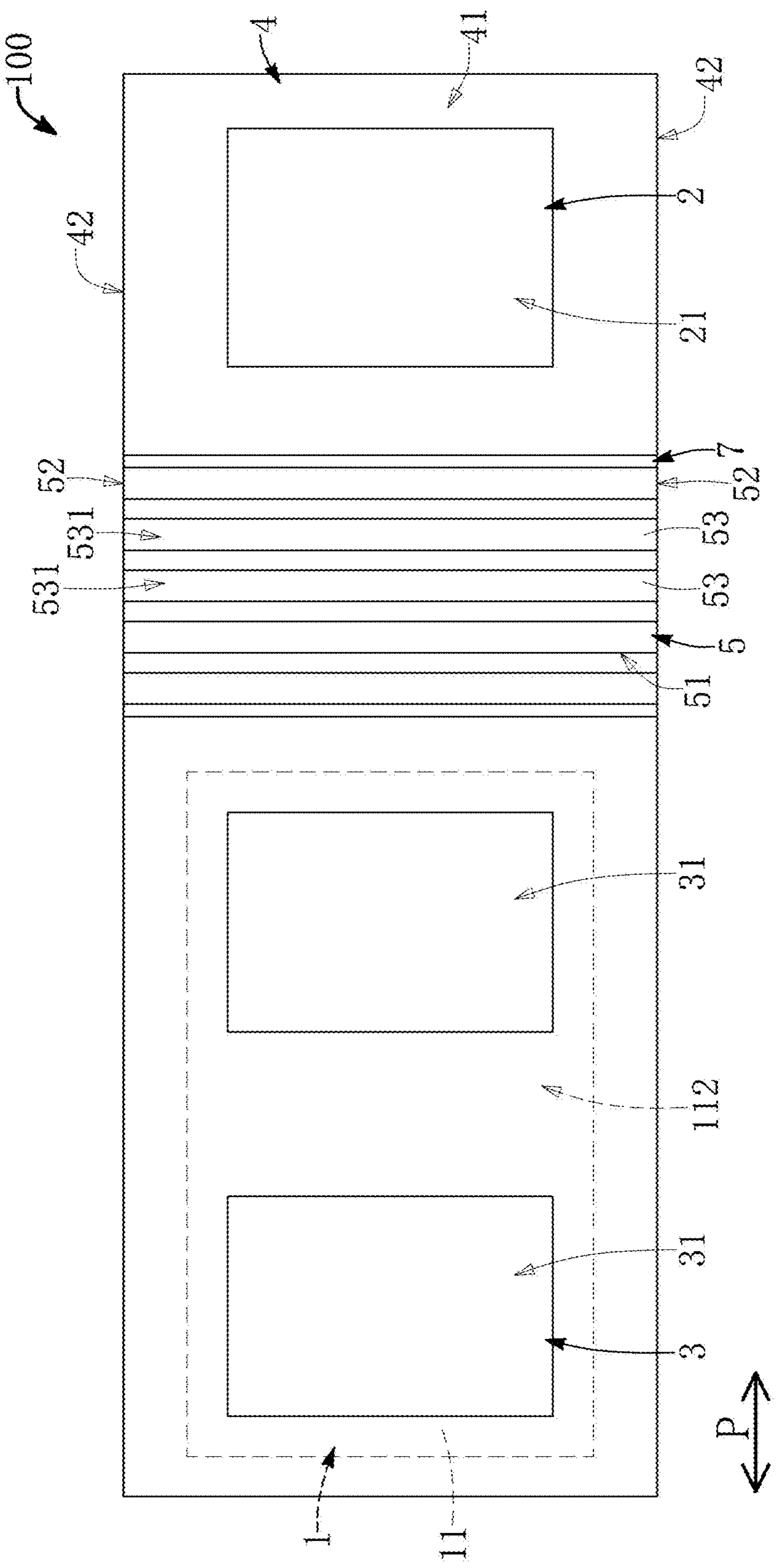
FIG. 3 is a schematic plan view of FIG. 1.

Please refer to FIG. 1 to FIG. 3, which illustrate Embodiment I of the present invention. This embodiment discloses a power chip package structure 100, which preferably adopts a wire-less architecture. For example, the power chip package structure 100 may adopt a Dual Flat No-Lead (DFN) package structure or a Quad Flat No-Lead (QFN) package structure, but the present invention is not limited thereto.

The power chip package structure 100 in this embodiment includes a power chip 1, a first transmission member 2 connected to one side of the power chip 1, and two second transmission members 3 connected to the other side of the power chip 1, a encapsulant 4 that encapsulates the above-mentioned components, and an insulating inorganic member 5 fixed to the encapsulant 4.

The power chip 1 includes a chip body 11, a first bonding pad 12 formed on one side of the chip body 11, and two second bonding pads 13 formed on the other side of the chip body 11. In this embodiment, the chip body 11 has a first surface 111 and a second surface 112 opposite to the first surface 111. The first bonding pad 12 is located on the first surface 111 and may be a drain pad, and the two second bonding pads 13 are located on the second surface 112 and spaced apart from each other. The two second bonding pads 13 may be a source pad and a gate pad respectively, but not limited thereto.

It should be noted that the type of the power chip 1 can be adjusted and changed according to actual needs. For example, the power chip 1 may comprise an insulated gate bipolar transistor (IGBT), a power MOSFET, a bipolar junction transistor (BJT), a silicon carbide (SIC) power device, a gallium nitride (GaN) power device, a high electron mobility transistor (HEMT), or a fast recovery diode (FRD).

The first transmission member 2 is connected to the first bonding pad 12, and the first transmission member 2 has a first end surface 21 disposed away from the first bonding pad 12. The two second transmission members 3 are respectively connected to the two second bonding pads 13, and each second transmission member 3 has a second end surface 31 disposed away from the second bonding pad 13 to which it is connected.

It should be noted that the power chip package structure 100 in this embodiment includes a plurality of conductive pastes 6, and the first transmission member 2 is sintered and fixed to the first bonding pad 12 through one of the plurality of conductive paste 6. Each of the second transmission members 3 is sintered and fixed to the corresponding second bonding pad 13 through another one of the plurality of conductive paste 6, but the present invention is not limited to this.

In this embodiment, the first transmission member 2 is a lead frame, and one end of the lead frame has the first end surface 21, and the other end of the lead frame is connected to the first bonding pad 12. In an alternative embodiment of the invention, the first transmission member 2 may be made from a copper clip (not shown). Each of the second transmission members 3 is a metal block, and the two second transmission members 3 are respectively connected to the two second bonding pads 13, but the present invention is not limited to this. Further, the lead frame has a bending section 22 connected between the one end and the other end, and a part of the bending section 22 is higher than the one end of the lead frame, so as to expand the space it surrounds.

The power chip 1, the first transmission member 2, and the two second transmission members 3 are embedded in the encapsulant 4, and the power chip 1, the first transmission member 2, and the two second transmission members 3 only have the first end surface 21 and the second end surface 31 exposed outside the encapsulant 4, but the invention is not limited to this.

More specifically, in this embodiment, the encapsulant 4 is generally in the shape of a rectangular block and its outer surface includes a layout surface 41 and two side end surfaces 42 respectively connected to opposite edges of the layout surface 41. The first end surface 21 and the two second end surfaces 31 are exposed from the layout surface 41, and the first end surface 21 and the two second end surfaces 31 may be coplanar with the layout surface 41. The power chip 1, the first transmission member 2, and the two second transmission members 3 are all located between the two side end surfaces 42 of the encapsulant 4.

Furthermore, the encapsulant 4 is formed with a slot 43 recessed into the layout surface 41 and penetrating the two side end surfaces 42, and this embodiment the slot 43 extends from the layout surface 41 toward the bending section 22 but does not touch the bending section 22. The slot bottom 431 of the slot 43 is adjacent to the bending section 22, and the slot opening 432 of the slot 43 is located on the layout surface 41. The distance H43 between the slot bottom 431 and the slot opening 432 of the slot 43 is preferably greater than the distance H112 between the second surface 112 of the chip body 11 and the layout surface 41 of the encapsulant 4, but the invention is not limited to this.

Accordingly, the first end surface 21 and the adjacent second end surface 31 are separated by the slot 43 along a preset direction P and are separated by a separation distance D. In this embodiment, the preset direction P is perpendicular to the normal direction of the layout surface 41 and also perpendicular to the normal direction of any of the side end surfaces 42. The slot opening 432 of the slot 43 is as close as possible to, but does not touch, the first end surface 21 and the adjacent second end surface 31.

The insulating inorganic member 5 is made of ceramic or glass in this embodiment, and the structure of the insulating inorganic member 5 roughly corresponds to the slot 43, but is not limited thereto. The insulating inorganic member 5 is fixed within the slot 43 and does not protrude from the slot opening 432 of the slot 43. Furthermore, the power chip package structure 100 in this embodiment includes an insulating thermally conductive adhesive 7, and the insulating inorganic member 5 is adhered and fixed in the slot 43 through the insulating thermally conductive adhesive 7. However, the present invention is not limited to this.

More specifically, the insulating inorganic member 5 is formed with an undulating surface 51 facing toward the slot opening 432, and the two ends of the undulating surface 51 are respectively adjacent to the two side end surfaces 42 of the encapsulant 4. In this embodiment, the insulating inorganic member 5 has two end surfaces 52, and the two end surfaces 52 of the insulating inorganic member 5 are respectively coplanar with the two side end surfaces 42 of the encapsulant 4. The two ends of the undulating surface 51 are respectively located on the two end surfaces 52. That is to say, the contours of the two end surfaces 52 will change along with the two ends of the undulating surface 51, but it is not limited to this.

Furthermore, a creepage path C along the undulating surface 51 is defined between the first end surface 21 and the adjacent second end surface 31, which is greater than the separation distance D. For example, the creepage path C may be 105% to 295% of the separation distance D, and the creepage path C is preferably 110% to 180% of the separation distance D. That is to say, the creepage path C changes correspondingly with the undulating surface 51.

As mentioned above, when the power chip package structure 100 disclosed in this embodiment adopts the same size as the existing power chip package structure, the creepage path C can be more accurately controlled to be larger than the standard of the creepage distance of the existing power chip package structure, thereby improving the performance of the power chip package structure 100 and reducing the possibility of damage.

From another perspective, when the creepage path C of the power chip package structure 100 disclosed in this embodiment adopts the same creepage distance standard as that of the existing power chip package structure, the size of the power chip package structure 100 can be further reduced to facilitate expanding the application of the power chip package structure 100.

In addition, the specific appearance of the undulating surface 51 can be adjusted and changed (such as wavy) according to actual needs. This embodiment only lists one of the better possible forms for illustration, but the invention is not limited thereto. For example, as shown in FIG. 1 to FIG. 3, the undulating surface 51 is formed with a plurality of fins 53 in this embodiment, and the free ends 531 of the plurality of fins 53 are coplanar with the layout surface 41 of the encapsulant 4. The free ends 531 of the plurality of fins 53 are each elongated and perpendicular to the preset direction P, and the free ends 531 of the plurality of fins 53 are arranged in a row along the preset direction P. The creepage path C passes through the plurality of the fins 53.

Embodiment II

Figure 4:
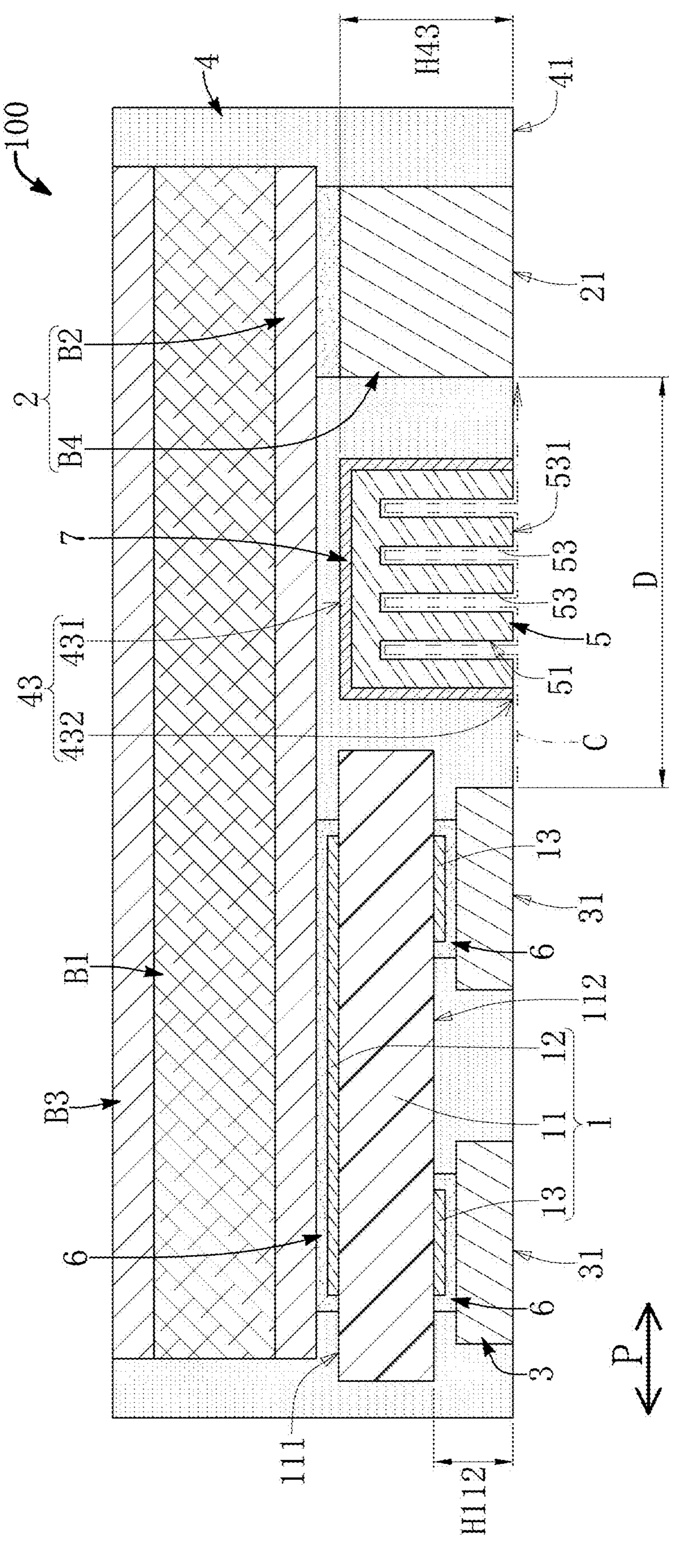
FIG. 4 is a schematic cross-sectional diagram of a power chip package structure according to Embodiment II of the present invention.

Please refer to FIG. 4, which illustrates Embodiment II of the present invention. Since this embodiment is similar to the above-mentioned Embodiment I, the common features between the two embodiments will not be described again (for example: the power chip 1, the two second transmission members 3, the encapsulant 4, and the insulating inorganic member 5), and the differences between this embodiment and the above-mentioned Embodiment I are briefly explained as follows.

In this embodiment, the power chip package structure 100 further includes a ceramic plate B1 embedded in the encapsulant 4, an inner metal layer B2 formed on the ceramic plate B1, and an extended metal block B4 connected to one end of the inner metal layer B2. The inner metal layer B2 and the extended metal block B4 are jointly defined as the first transmission member 2. The extended metal block B4 has the first end surface 21, and the other end of the inner metal layer B2 (sintered and fixed by the conductive paste 6) is connected to the first bonding pad 12.

Furthermore, the power chip package structure 100 further includes an outer metal layer B3, and the inner metal layer B2 and the outer metal layer B3 are respectively sintered and fixed on two opposite surfaces of the ceramic plate B1. The surface of the outer metal layer B3 away from the inner metal layer B2 is exposed from the encapsulant 4.

It should be noted that the inner metal layer B2 and the outer metal layer B3 in this embodiment may be formed on the ceramic plate B1 by using direct bonded copper (DBC) technology, direct plated copper (DPC) technology, or active metal brazing (AMB) technology according to actual needs, but not limited thereto.

Embodiment III

Figure 5:
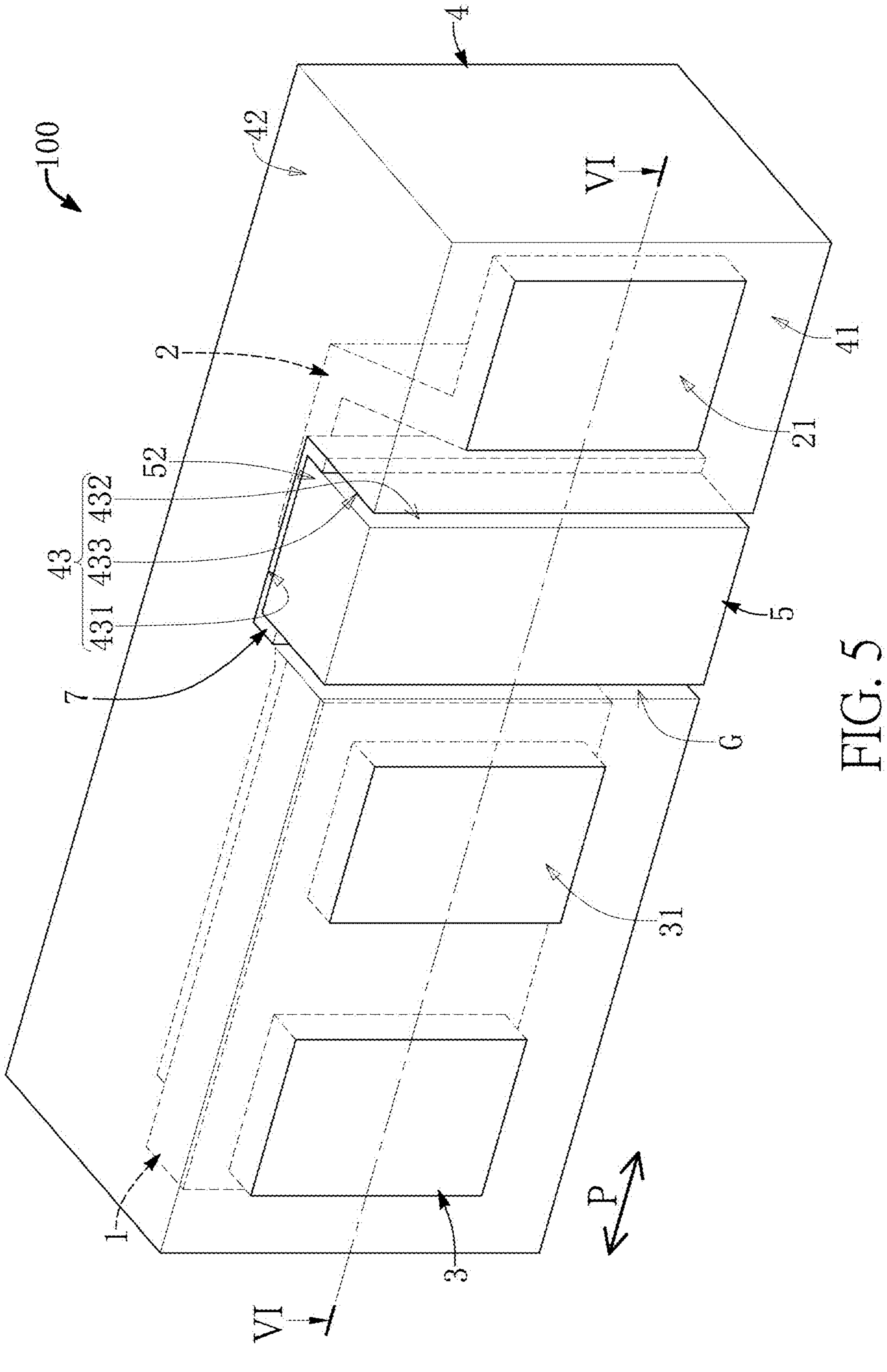
FIG. 5 is a schematic three-dimensional diagram of the power chip package structure according to Embodiment III of the present invention.
Figure 6:
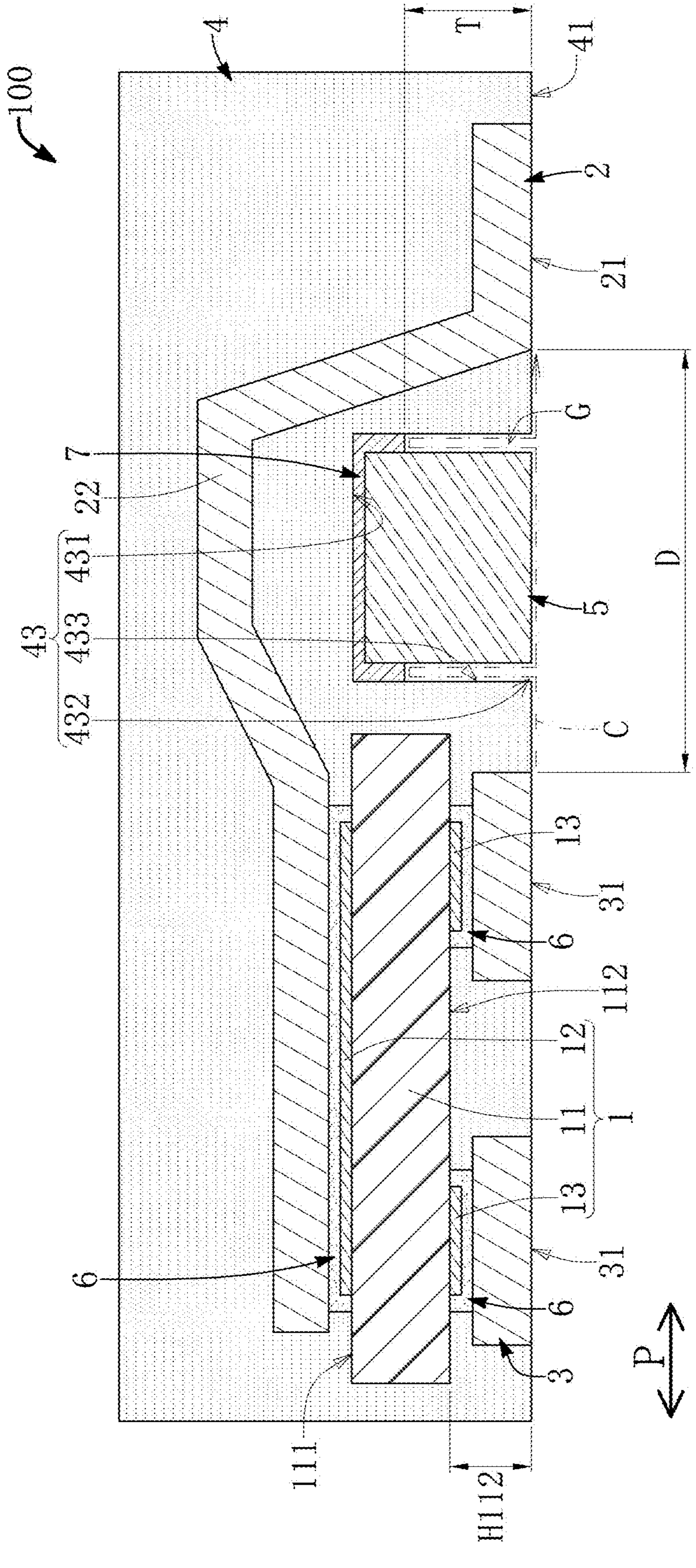
FIG. 6 is a schematic cross-sectional view taken along line VI-VI in FIG. 5.
Figure 7:
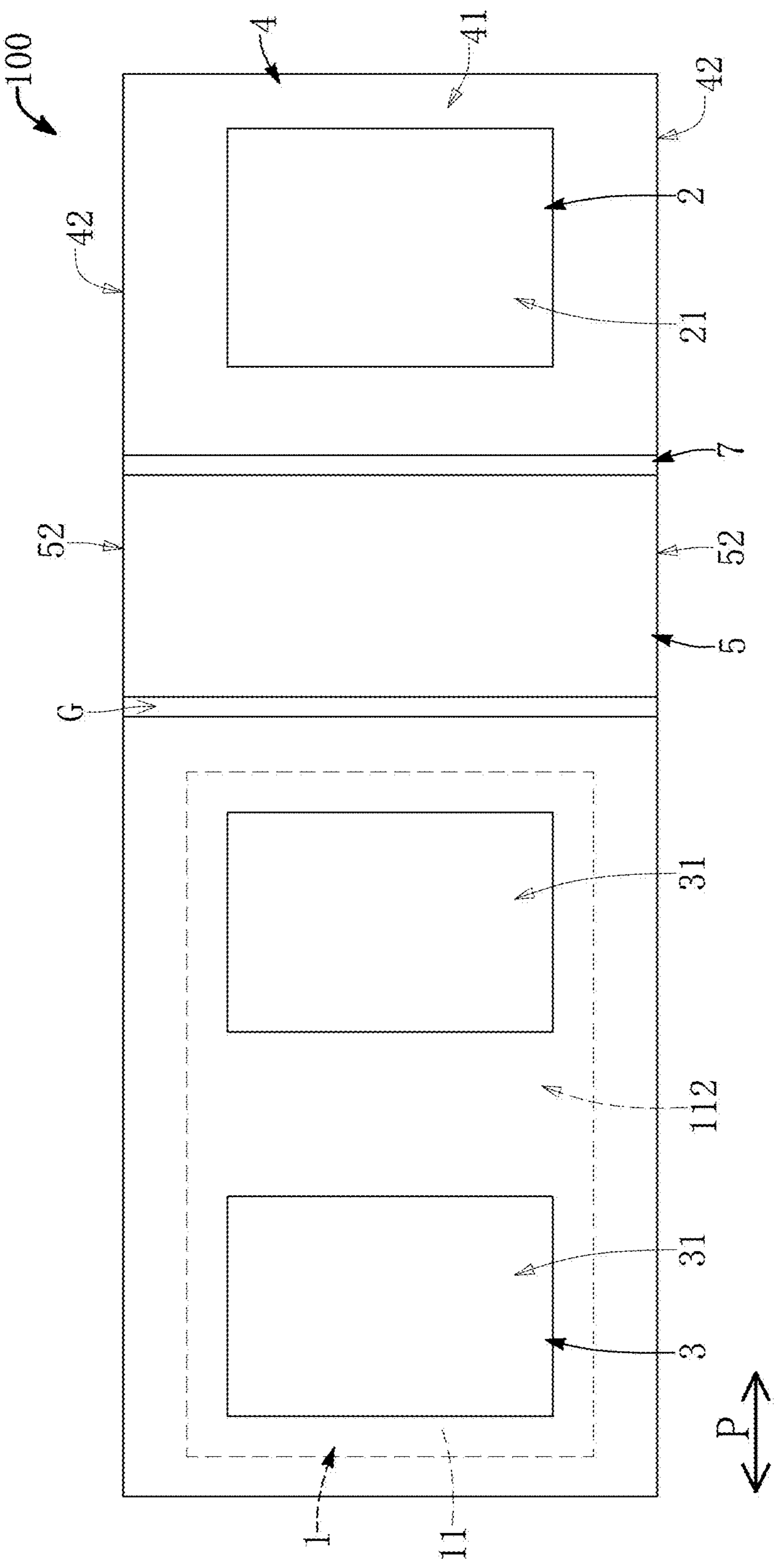
FIG. 7 is a schematic plan view of FIG. 5.

Please refer to FIG. 5 to FIG. 7, which illustrates Embodiment III of the present invention. Since this embodiment is similar to the above-mentioned Embodiments I and II, the common features in the above-mentioned embodiments will not be described again (for example: the power chip 1, the first transmission member 2, the two second transmission members 3, and the encapsulant 4). The differences between this embodiment and the above-mentioned Embodiments I and II are briefly explained as follows.

In this embodiment, the material of the insulating inorganic member 5 is ceramic or glass, and the structure of the insulating inorganic member 5 roughly corresponds to the slot 43, but is not limited thereto. The insulating inorganic member 5 is fixed within the slot 43 (for example, fixed on the slot bottom 431) and does not protrude from the slot opening 432 of the slot 43. Furthermore, the power chip package structure 100 in this embodiment includes an insulating thermally conductive adhesive 7, and the insulating inorganic member 5 is adhered and fixed to the slot bottom 431 of the slot 43 through the insulating thermally conductive adhesive 7, but the present invention is not limited thereto.

Furthermore, the slot 43 has two inner side walls 433 connected to the slot bottom 431, and the two inner side walls 433 are facing each other and perpendicular to the preset direction P. A gap G is formed between the insulating inorganic member 5 and each inner side wall 433, which is elongated and connected to the two side end surfaces 42 of the encapsulant 4. In this embodiment, a depth T of each gap G relative to the slot opening 432 is greater than the distance H112 between the second surface 112 of the chip body 11 and the layout surface 41 of the encapsulant 4.

Accordingly, a creepage path C along the outer surface of the insulating inorganic member 5 is defined between the first end surface 21 and the adjacent second end surface 31, which is greater than the separation distance. D. For example, the creepage path C may be 105% to 295% of the separation distance D, and the creepage path C is preferably 110% to 180% of the separation distance D. The creepage path C in this embodiment is along the two inner side walls 433 of the slot 43 and the insulating inorganic member 5.

In addition, in this embodiment, the first transmission member 2 is illustrated as a lead frame similar to that of Embodiment I, but the invention is not limited thereto. For example, in some embodiments not shown in the present invention, the first transmission member 2 can also adopt the structure similar to Embodiment II, and the power chip package structure 100 can adopt a direct copper coating (DBC) structure, a direct plated copper (DPC) structure, or an active metal brazing (AMB) structure.

Embodiment IV

Figure 8:
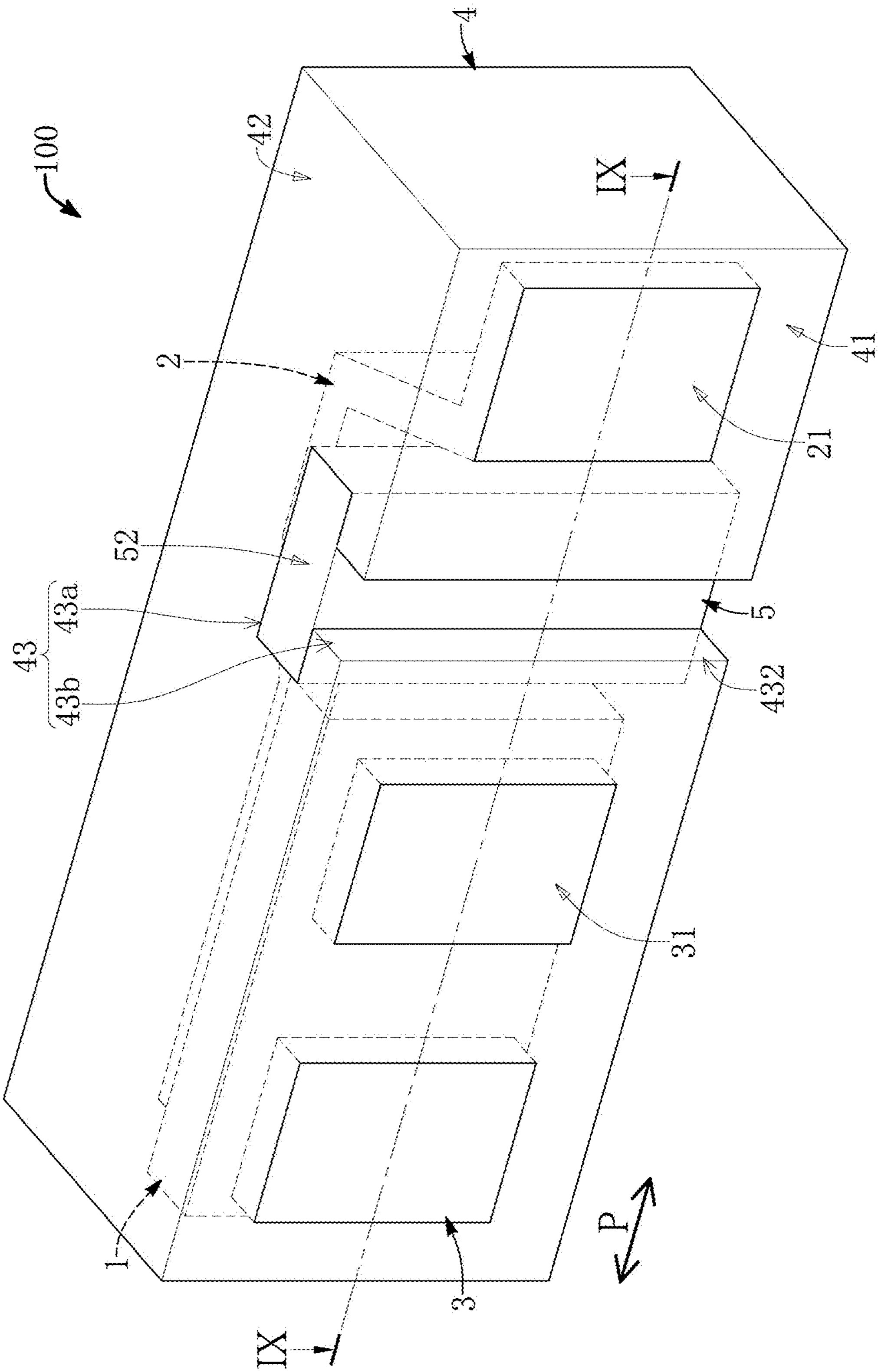
FIG. 8 is a schematic three-dimensional diagram of the power chip package structure according to Embodiment IV of the present invention.
Figure 9:
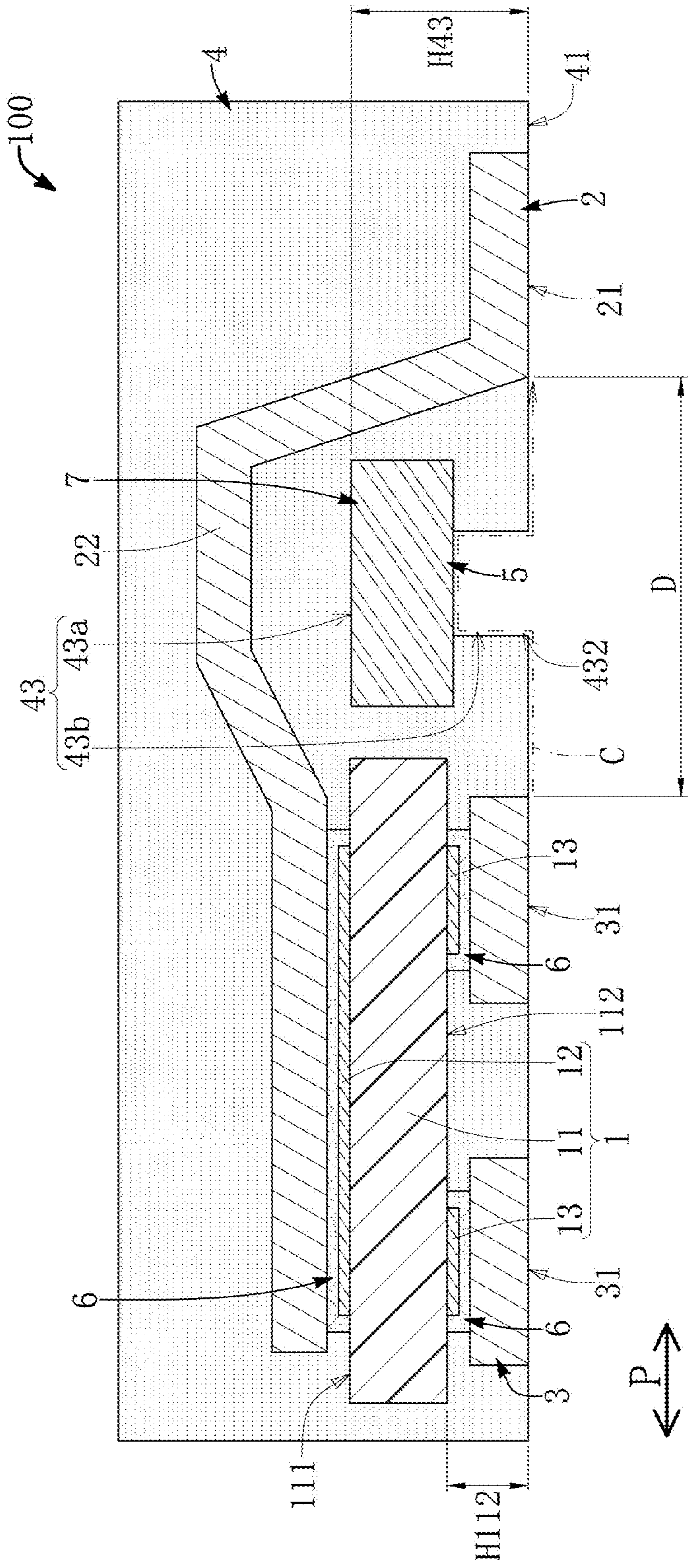
FIG. 9 is a schematic cross-sectional view taken along line IX-IX of FIG. 8.
Figure 10:
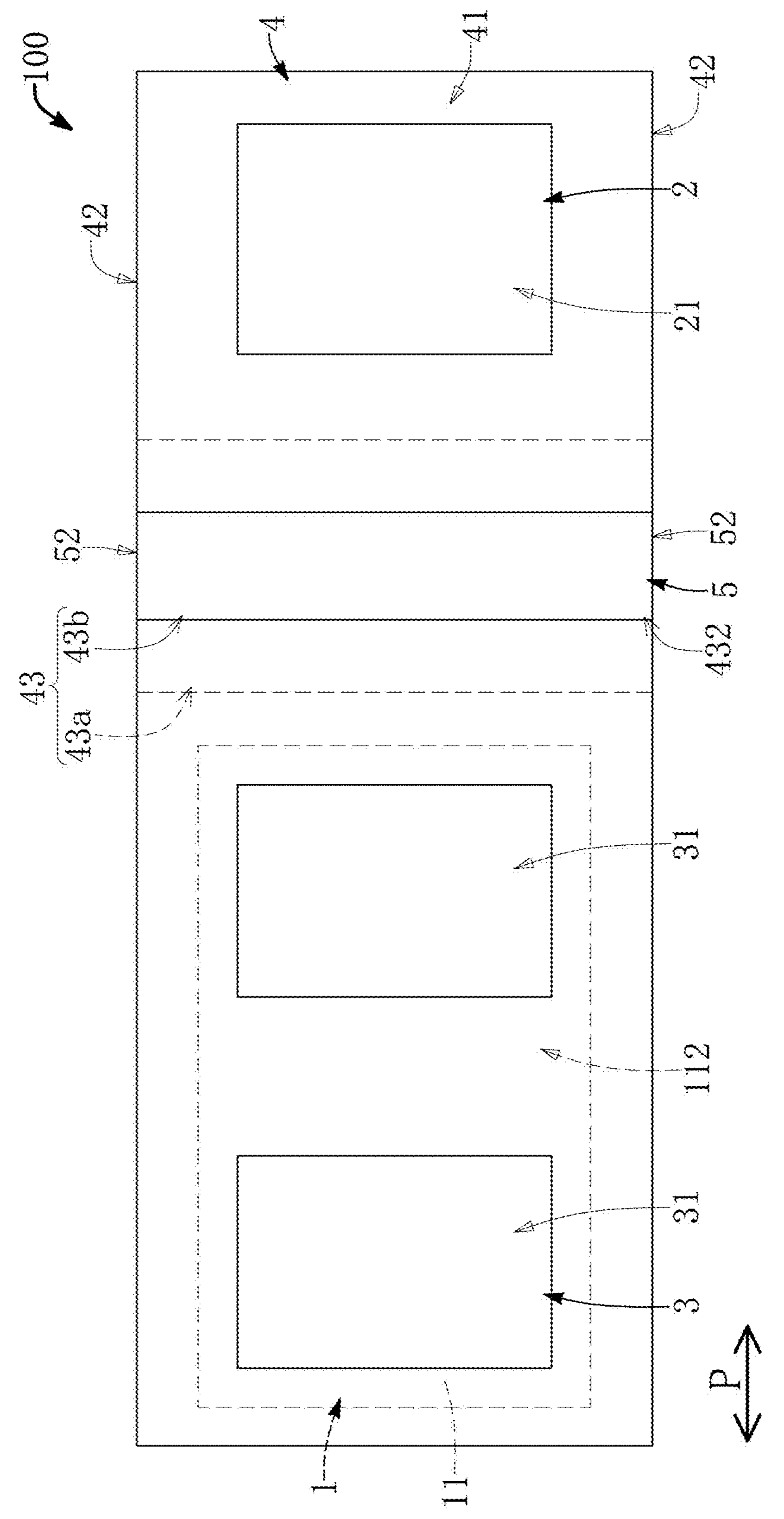
FIG. 10 is a schematic plan view of FIG. 8.

Please refer to FIG. 8 to FIG. 10, which illustrate Embodiment IV of the present invention. Since this embodiment is similar to the above-mentioned Embodiment III, the common features in the above-mentioned embodiments will not be repeated (for example: the power chip 1, the first transmission member 2, the two second transmission members 3, and the encapsulant 4). The differences between this embodiment and the above-mentioned Embodiment III are briefly explained as follows.

In this embodiment, the slot 43 includes a first slot region 43*a* and a second slot region 43*b* connected to the first slot region 43*a*, and the second slot region 43*b* has the slot opening 432. The insulating inorganic member 5 is embedded in the first slot region 43*a*, and the two end surfaces 52 of the insulating inorganic member 5 are respectively coplanar with the two side end surfaces 42 of the encapsulant 4. Part of the outer surface of the insulating inorganic member 5 is exposed to the outside through the second slot region 43*b*. Furthermore, in this embodiment, the creepage path C is along the two inner walls of the second slot region 43*b* and part of the outer surface of the insulating inorganic member 5.

More specifically, in this embodiment, the insulating inorganic member 5 is disposed in the first slot region 43*a* through insert molding, so that the insulating inorganic member 5 is in contact with and fixed to the encapsulant 4 and no glue material is disposed between the insulating inorganic member 5 and the encapsulant 4, but not limited thereto.

Technical Effects of Embodiments of the Present Invention

To sum up, when the power chip package structure disclosed in the embodiments of the present invention adopts the same size as the existing power chip package structure, the creepage path can be more accurately controlled to be larger than the standard for the creepage distance of the existing power chip package structure, thereby improving the performance of the power chip package structure and reducing the possibility of damage.

From another perspective, when the creepage path of the power chip package structure disclosed in the embodiments adopts the same creepage distance standard as that of the existing power chip package structure, the size of the power chip package structure can be further reduced. Therefore, it is beneficial to expand the application of the power chip package structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power chip package structure, comprising:

a power chip, comprising:

a chip body including a first surface and an opposing second surface;

a first bonding pad located on the first surface; and two second bonding pads spaced apart from each other on the second surface;

a first transmission member connected to the first bonding pad, wherein the first transmission member has a first end surface away from the first bonding pad;

two second transmission members respectively connected to the two second bonding pads, wherein each of the two second transmission members has a second end surface away from the second bonding pad to which it is connected;

an encapsulant encapsulating the power chip, the first transmission member, and the two second transmission members; wherein the encapsulant comprises:

a layout surface that exposes the first end surface and the two second end surfaces; and two side end surfaces respectively connected to opposite end edges of the layout surface, wherein the encapsulant comprises a slot recessed into the layout surface, wherein the slot penetrates the two side end surfaces;

wherein the first end surface and an adjacent one of the two second end surfaces are separated by the slot along a preset direction and are separated by a separation distance; and an insulating inorganic member fixed within the slot, wherein the insulating inorganic member does not protrude from a slot opening of the slot, wherein the insulating inorganic member is formed with an undulating surface facing the slot opening, and two ends of the undulating surface are respectively adjacent to the two side end surfaces of the encapsulant;

wherein a creepage path along the undulating surface is defined between the first end surface and an adjacent said second end surface, which is greater than the separation distance.

2. The power chip package structure according to claim 1, wherein the insulating inorganic member has two end surfaces, the two ends of the undulating surface are respectively located on the two end surfaces, and the two end surfaces of the insulating inorganic member are respectively coplanar with the two side end surfaces of the encapsulant.

3. The power chip package structure according to claim 1, wherein the undulating surface is formed with a plurality of fins, and free ends of the plurality of fins are coplanar with the layout surface of the encapsulant, wherein the creepage path passes through the plurality of the fins.

4. The power chip package structure according to claim 1, wherein the first transmission member is a lead frame or a copper clip, wherein one end of the lead frame has the first end surface, and the other end of the lead frame is connected to the first bonding pad, wherein each of the second transmission members is a metal block, and the two second transmission members are respectively connected to the two second bonding pads.

5. The power chip package structure according to claim 4, wherein the lead frame has a bending section connected between the one end and the other end, and the slot extends from the layout surface toward the bending section.

6. The power chip package structure of claim 1, wherein the power chip package structure comprises a ceramic plate embedded in the encapsulant, an inner metal layer formed on the ceramic plate, and an extended metal block connected to one end of the inner metal layer, wherein the inner metal layer and the extended metal block are jointly defined as the first transmission member, wherein the extended metal block has the first end surface, and the other end of the inner metal layer is connected to the first bonding pad; wherein each of the two second transmission members is a metal block, and the two second transmission members are respectively connected to the two second bonding pads.

7. The power chip package structure according to claim 6, wherein the power chip package structure comprises an outer metal layer, and the inner metal layer and the outer metal layer are respectively sintered and fixed on opposite sides of the ceramic plate, wherein a surface of the outer metal layer away from the inner metal layer is exposed from the encapsulant.

8. The power chip package structure according to claim 1, wherein a distance between a slot bottom of the slot and the slot opening is greater than a distance between the second surface of the chip body and the layout surface of the encapsulant.

9. The power chip package structure according to claim 1, wherein the power chip package structure comprises an insulating thermally conductive adhesive, and the insulating inorganic member is adhered and fixed in the slot through the insulating thermally conductive adhesive.

10. The power chip package structure according to claim 1, wherein the power chip package structure comprises a plurality of conductive pastes, and the first transmission member is sintered and fixed to the first bonding pad through one of the plurality of conductive pastes, each of the two second transmission members is fixed to corresponding one of the two second bonding pads by sintering with one of the plurality of conductive pastes.

11. The power chip package structure according to claim 1, wherein a material of the insulating inorganic member is ceramic or glass, wherein the first bonding pad is a drain pad, and the two second bonding pads are respectively a source pad and a gate pad; wherein the creepage path is 105% to 295% of the separation distance.

12. A power chip package structure, comprising:

a power chip, comprising:

a chip body including a first surface and an opposing second surface;

a first bonding pad located on the first surface; and two second bonding pads spaced apart from each other on the second surface;

a first transmission member connected to the first bonding pad, wherein the first transmission member has a first end surface away from the first bonding pad;

two second transmission members respectively connected to the two second bonding pads, wherein each of the two second transmission members has a second end surface away from the second bonding pad to which it is connected;

an encapsulant encapsulating the power chip, the first transmission member, and the two second transmission members, wherein the encapsulant comprises:

a layout surface that exposes the first end surface and the two second end surfaces; and two side end surfaces respectively connected to opposite end edges of the layout surface, wherein the encapsulant comprises a slot recessed into the layout surface, wherein the slot penetrates the two side end surfaces;

wherein the first end surface and adjacent one of the two second end surfaces are separated by the slot along a preset direction and are separated by a separation distance; and an insulating inorganic member fixed within the slot, wherein the insulating inorganic member does not protrude from a slot opening of the slot, wherein two end surfaces of the insulating inorganic member are respectively adjacent to the two side end surfaces of the encapsulant;

wherein a creepage path along an outer surface of the insulating inorganic member is defined between the first end surface and an adjacent said second end surface, which is greater than the separation distance.

13. The power chip package structure according to claim 12, wherein the slot has a slot bottom and two inner side walls connected to the slot bottom, the insulating inorganic member is fixed to the slot bottom, wherein a gap is formed between the insulating inorganic member and each of the two inner side walls, wherein the creepage path passes through the two inner side walls of the slot.

14. The power chip package structure of claim 13, wherein a depth of the gap relative to the slot opening is greater than a distance between the second surface of the chip body and the layout surface of the encapsulant.

15. The power chip package structure according to claim 13, wherein the power chip package structure comprises an insulating thermally conductive adhesive, and the insulating inorganic member is adhesively fixed to the slot bottom of the slot through the insulating thermally conductive adhesive.

16. The power chip package structure according to claim 12, wherein the slot comprises a first slot region and a second slot region connected to the first slot region, and the second slot region has the slot opening, wherein the insulating inorganic member is embedded in the first slot region, and part of the outer surface of the insulating inorganic member is exposed through the second slot region; wherein the creepage path passes through the two inner side walls of the second slot region and the part of the outer surface of the insulating inorganic member.

17. The power chip package structure according to claim 16, wherein the insulating inorganic member is placed in the first slot region through insert molding, so that the insulating inorganic member is fixed to and in contact with the encapsulant, wherein no glue material is disposed between the insulating inorganic member and the encapsulant.

18. The power chip package structure according to claim 12, wherein the first transmission member is a lead frame, and one end of the lead frame has the first end surface, and the other end of the lead frame is connected to the first bonding pad; wherein each of the two second transmission members is a metal block, and the two second transmission members are respectively connected to the two second bonding pads.

19. The power chip package structure according to claim 12 further comprising a plurality of conductive pastes, and the first transmission member is sintered and fixed to the first bonding pad through one of the plurality of conductive pastes, and each of the two second transmission members is fixed to corresponding one of the two second bonding pads by sintering with another one of the plurality of conductive pastes.

20. The power chip package structure according to claim 12, wherein the insulating inorganic member is made of ceramic or glass, wherein the first bonding pad is a drain pad, and the two second bonding pads are a source pad and a gate pad respectively, wherein the creepage path is 105% to 295% of the separation distance, and wherein the two end surfaces of the insulating inorganic member are respectively coplanar with the two side end surfaces of the encapsulant.

* * * * *